United States Patent
Chen et al.

(10) Patent No.: US 11,670,520 B2
(45) Date of Patent: Jun. 6, 2023

(54) PACKAGE STRUCTURE WITH INTERCONNECTION BETWEEN CHIPS AND PACKAGING METHOD THEREOF

(71) Applicant: UNIMICRON TECHNOLOGY CORP., Taoyuan (TW)

(72) Inventors: Jia Shiang Chen, Taoyuan (TW); Chung-Yu Lan, Taipei (TW); Yu-Shen Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 79 days.

(21) Appl. No.: 17/523,093

(22) Filed: Nov. 10, 2021

(65) Prior Publication Data
US 2023/0102457 A1  Mar. 30, 2023

(30) Foreign Application Priority Data
Sep. 28, 2021  (TW) ................. 110136061

(51) Int. Cl.
*H01L 21/00* (2006.01)
*H01L 21/48* (2006.01)
(Continued)

(52) U.S. Cl.
CPC ...... *H01L 21/486* (2013.01); *H01L 23/49805* (2013.01); *H01L 23/5384* (2013.01);
(Continued)

(58) Field of Classification Search
CPC ............. H01L 21/486; H01L 23/49805; H01L 23/5384
See application file for complete search history.

(56) References Cited

U.S. PATENT DOCUMENTS 7,952,182 B2 *  5/2011  Watts .................... H01L 25/105
                                                      257/E23.001
8,022,511 B2     9/2011  Chiu
(Continued)

FOREIGN PATENT DOCUMENTS

| TW | I358117 B | 2/2012 |
|----|-----------|--------|
| TW | I710099 B | 11/2020 |
| TW | I721525 B | 3/2021 |

*Primary Examiner* — Thao P Le
(74) *Attorney, Agent, or Firm* — WPAT, P.C

(57) ABSTRACT

A packaging method includes steps of: forming first and second wiring layers electrically connected to each other on two opposite surfaces of a substrate; then configuring mother substrate interconnecting bumps on the first wiring layer and along perimeter of a daughter substrate unit, and then cutting along the perimeter of the daughter substrate unit to expose lateral faces of the mother substrate interconnecting bumps and configuring solder materials thereon; then configuring first and second chips on the first and the second wiring layers to form electrical interconnection between the two chips. A package structure enables interconnecting two chips through one single daughter substrate unit with its wiring layers directly connecting with lateral face contacts of the mother carrier substrate through the mother substrate interconnecting bumps. Hence, area of the daughter substrate unit is reduced; lengths of the interconnection paths are shortened, and qualities of communication and space utilization are enhanced.

19 Claims, 20 Drawing Sheets

(51) Int. Cl.
*H01L 23/538* (2006.01)
*H01L 23/498* (2006.01)
*H05K 1/18* (2006.01)
*H01L 25/065* (2023.01)

(52) U.S. Cl.
CPC ......... *H01L 25/0657* (2013.01); *H05K 1/182* (2013.01); *H05K 1/186* (2013.01); *H01L 2225/06517* (2013.01); *H01L 2225/06572* (2013.01)

(56) References Cited

U.S. PATENT DOCUMENTS

| | | | |
|---|---|---|---|
| 9,941,593 B2* | 4/2018 | Ozdemir | H01Q 9/0442 |
| 10,477,683 B2 | 11/2019 | Baek et al. | |
| 2003/0047801 A1* | 3/2003 | Azuma | H01L 23/49827 |
| | | | 257/E23.07 |
| 2011/0031619 A1* | 2/2011 | Chen | H01L 21/563 |
| | | | 257/737 |
| 2011/0221046 A1 | 9/2011 | Xiao | |
| 2015/0097277 A1* | 4/2015 | Chen | H01L 23/49861 |
| | | | 257/668 |
| 2016/0027711 A1* | 1/2016 | Harada | H01L 23/49827 |
| | | | 257/698 |
| 2017/0221835 A1 | 8/2017 | Yoo | |
| 2021/0013586 A1 | 1/2021 | Yamada | |

\* cited by examiner

PACKAGE STRUCTURE WITH INTERCONNECTION BETWEEN CHIPS AND PACKAGING METHOD THEREOF

CROSS REFERENCE TO RELATED APPLICATION

This non-provisional application claims the benefit under 35 U.S.C. § 119(e) to patent application No. 110136061 filed in Taiwan on Sep. 28, 2021, which is hereby incorporated in its entirety by reference into the present application.

BACKGROUND OF THE INVENTION

1. Field of the Invention

The present invention relates to a chip package structure and packaging method thereof, particularly to a package structure with interconnection between chips and a packaging method thereof.

2. Description of the Related Art

Please refer to FIG. 15. Under current chip packaging technology, in order to achieve electrical connections between two chips in the same package, generally, it is necessary to place the first chip 81 on an upper surface 911 of a first daughter carrier substrate 91 through soldering, and to place a second chip 82 on an upper surface 921 of a second daughter carrier substrate 92 through soldering; and a lower surface 912 of the first daughter carrier substrate 91 and a lower surface 922 of the second daughter carrier substrate 92 are placed side by side on a surface 931 of a mother carrier substrate 93 through soldering, respectively; and the first chip 81 is electrically connected to the second chip 82 through multiple wiring layers 913 of the first daughter carrier substrate 91, multiple wiring layers 932 of the mother carrier substrate 93 and multiple wiring layers 923 of the second daughter carrier substrate 92.

In the above-mentioned method of chip interconnection and placement, the daughter carrier substrates 91, 92 of the two chips 81, 82 are placed side by side on the surface 931 of the mother carrier substrate 93, and that occupies relatively large surface area of the mother carrier substrate 93; such that, the area of the mother carrier substrate 93 cannot be further reduced. In addition, the interconnecting paths between the two chips 81, 82 need to go through the plated through holes 914, 933, 924 among wiring layers 913, 932, 923 multiple times on a direction perpendicular to the substrates to pass through the first daughter carrier substrate 91, the mother carrier substrate 93 and the second daughter carrier substrate 92 and that tends to cause signal loss for transmitted signals due to reflections at the plated through holes. Moreover, the transmitted signals are also required to propagate horizontally on multiple wiring layers 913, 932 and 923. Due to the requirements on signal qualities for high speed/high frequency communication technology, the lengths of the interconnecting wires need to be short enough. Accordingly, the placement of the interconnecting wires on the mother carrier substrate 93 is restricted to be right between the first daughter carrier substrate 91 and the second daughter carrier substrate 92, which imposes restrictions on the placement of the interconnecting wires and the area, and fails to fully utilize all the area of the mother carrier substrate 93 for the placement of the interconnecting wires. As a result, the number of the pinouts and the number of interconnecting wires of the two chips are restricted.

Hence, structures and methods of the current packaging of interconnecting chips awaits improvements.

SUMMARY OF THE INVENTION

In view of the above-mentioned problems, and in order to overcome the problems of the current structure and method of the packaging for interconnecting chips, namely, the problem of poor area utilization rate of the carrier substrate that causes restrictions on the placement area and the number of the interconnecting wires between chips, as well as the problem that the area of the mother carrier substrate cannot be effectively reduced, the present invention provides a package structure with interconnection between chips and a packaging method thereof.

The packaging method of interconnection between chips of the present invention includes the following steps:

preparing a substrate having an upper surface and a lower surface; and the substrate including a daughter substrate unit having multiple through holes;

forming a first wiring layer on a first surface of the daughter substrate unit, and forming a second wiring layer on a second surface of the daughter substrate unit, and forming plated through holes in the through holes of the daughter substrate unit, and connecting the first wiring layer electrically with the second wiring layer through the plated through holes;

configuring a mother substrate interconnecting bump on the first wiring layer, wherein the mother substrate interconnecting bump is configured at a perimeter of the daughter substrate unit;

performing a cutting procedure along the perimeter of the daughter substrate unit to expose a lateral face of the mother substrate interconnecting bump.

In one embodiment of the present invention, the packaging method of interconnection between chips includes the following step:

configuring a solder layer on a lateral face of the mother substrate interconnecting bump.

In one embodiment of the present invention, the packaging method of interconnection between chips includes the following step:

configuring a first chip on the first wiring layer of the daughter substrate unit, and configuring a second chip on the second wiring layer of the daughter substrate unit, wherein, the first chip electrically connects with the second chip through the first wiring layer, the second wiring layer and each of the plated through holes.

In one embodiment of the present invention, the packaging method of interconnection between chips includes the following steps:

performing build-up wiring layer processes on the first wiring layer and the second wiring layer to respectively configure a first build-up wiring layer structure on the first wiring layer and a second build-up wiring layer structure on the second wiring layer;

configuring a first solder mask layer and a second solder mask layer respectively on the first build-up wiring layer structure and the second build-up wiring layer structure, and the first solder mask layer exposing multiple first chip solder pads of the first build-up wiring layer structure, and the second solder mask layer exposing multiple second chip solder pads of the second build-up wiring layer structure.

In one embodiment of the present invention, the packaging method of interconnection between chips includes the following steps:

removing portions of the first solder mask layer and the first build-up wiring layer structure along the perimeter of the daughter substrate unit to expose a top face of the mother substrate interconnecting bump; wherein in the step of configuring a solder layer on a lateral face of the mother substrate interconnecting bump, the solder layer extends from the lateral face of the mother substrate interconnecting bump to the top face of the mother substrate interconnecting bump.

In one embodiment of the present invention, the packaging method of interconnection between chips includes the following steps:

forming a seeding layer beforehand on the upper surface and the lower surface of the substrate; and after completing the step of configuring a mother substrate interconnecting bump on the first wiring layer, the method further including:

removing portions of the seeding layer not covered by the first wiring layer and the second wiring layer.

In one embodiment of the present invention, the substrate includes multiple daughter substrate units, and each of the multiple daughter substrate units is arranged periodically.

In one embodiment of the present invention, the substrate further includes multiple cutting zones, and each of the multiple cutting zones is arranged between corresponding perimeters of two adjacent daughter substrate units; and in the step of performing the cutting procedure along the perimeter of the daughter substrate unit to expose the lateral face of the mother substrate interconnecting bump, all the materials in each of the multiple cutting zones are removed to expose the lateral face of the mother substrate interconnecting bump towards the cutting zone.

In one embodiment of the present invention, before the step of performing the cutting procedure along the perimeter of the daughter substrate unit to expose the lateral face of the mother substrate interconnecting bump, the following steps are further included:

covering the first wiring layer and the second wiring layer respectively with a protection layer; and after completing the step of configuring a solder layer on a lateral face of the mother substrate interconnecting bump, the following step is further included:

removing the protection layer on the first wiring layer and the second wiring layer.

In one embodiment of the present invention, after completing the step of configuring a solder layer on a lateral face of the mother substrate interconnecting bump, the following step is further included:

detaching the daughter substrate unit from other portions of the substrate to complete an independent daughter carrier substrate, wherein the first chip and the second chip are configured on the daughter carrier substrate.

In one embodiment of the present invention, the packaging method of interconnection between chips includes the following steps:

preparing a mother carrier substrate which includes multiple wiring layers, and a daughter carrier substrate accommodating slot; the daughter carrier substrate accommodating slot including a sidewall, and a lateral face contact of the multiple wiring layers protruding from the sidewall;

inserting the daughter carrier substrate mounted with the first chip and second chip into the daughter carrier substrate accommodating slot, so that the lateral face of the mother substrate interconnecting bump faces towards the sidewall of the daughter carrier accommodating slot;

connecting the mother substrate interconnecting bump with the lateral face contact of the mother carrier substrate through the solder layer.

The present invention further provides a package structure with interconnection between chips including:

a daughter carrier substrate including a substrate, wiring layers and a mother substrate interconnecting bump, and, in addition, the daughter carrier substrate having a first surface and a second surface opposite to the first surface; the mother substrate interconnecting bump being configured on a wiring layer of the multiple wiring layers and on a perimeter of the daughter carrier substrate, and a lateral face of the mother substrate interconnecting bump being exposed towards the outside of the daughter carrier substrate.

In one embodiment of the present invention, the package structure with interconnection between chips further includes: a solder layer configured on the lateral face of the mother substrate interconnecting bump.

In one embodiment of the present invention, the mother substrate interconnecting bump has a top face, and the solder layer extends from the lateral face of the mother substrate interconnecting bump to the top face of the mother substrate interconnecting bump.

In one embodiment of the present invention, the package structure with interconnection between chips further includes: a first chip, configured on the first surface of the daughter carrier substrate, and electrically connected with a wiring layer of the first surface; and a second chip, configured on the second surface of the daughter carrier substrate, and electrically connected with a wiring layer of the second surface; and the first chip electrically connected with the second chip through the wiring layers.

In one embodiment of the present invention, the package structure with interconnection between chips further includes:

a mother carrier substrate, including wiring layers, and having a daughter carrier substrate accommodating slot; the daughter carrier substrate accommodating slot penetrating at least two wiring layers of the multiple wiring layers; the daughter carrier substrate accommodating slot having a sidewall, and structures of the multiple wiring layers including a lateral face contact protruding from the sidewall;

wherein the daughter carrier substrate, the first chip and the second chip are configured in the daughter carrier substrate accommodating slot, and the lateral face of the mother substrate interconnecting bump is facing towards the sidewall of the daughter carrier substrate accommodating slot, and the mother substrate interconnecting bump of the daughter carrier substrate connects with the lateral face contact of the mother carrier substrate through the solder layer on the lateral face.

In one embodiment of the present invention, the lateral face of the mother substrate interconnecting bump is aligned along a cutting plane of the substrate.

The present invention discloses a new carrier substrate interconnection technology for interconnecting chips. Plated through holes are formed directly on a substrate, through which, wiring layers configured on two opposite surfaces of the substrate are electrically connected. In this way, a first chip and a second chip which are to be signally connected can be directly configured on two opposite surfaces of a daughter carrier substrate made from the substrate, and accordingly, the first chip and the second chip can be electrically and signally connected through the wiring layers of the daughter carrier substrate and the plated through holes of the substrate. In other words, the path of the signal interconnection between the first chip and the second chip is only within wiring layers of a single daughter carrier substrate. Whereas, in prior arts, a long horizontal path of the signal interconnection between the first chip and the second chip needs to go through two daughter carrier substrates and one mother carrier substrate. Therefore, length of the path of the signal interconnection between the first chip and the second chip is significantly shortened, and a number of times the electric signal has to cross solder joints of the plated through holes and horizontal trace of the wiring is also reduced, thereby the signal quality between the two chips can be enhanced.

Moreover, the daughter carrier substrate includes a mother substrate interconnecting bump configured on the perimeter of the daughter carrier substrate, such that, a lateral face of the mother substrate interconnecting bump is exposed and faces towards the outside of the daughter carrier substrate. Solder material is configured on the lateral face of the mother substrate. In other words, a lateral face of the mother substrate interconnecting bump at the perimeter of the daughter carrier substrate correspondingly connects to a lateral face contact of the mother substrate. This method of configuring connecting points with the mother substrate enables the daughter carrier substrate, with chips connected on its first and second surfaces, to connect with the mother substrate. The signals of the first chip and the second chip are integrated within the daughter carrier substrate firstly, before transmitted to the mother substrate. Hence, the amount of wiring needs to be configured in the mother substrate and signal density passing through the mother substrate are reduced to further enhance the signal quality of the signals between the two chips and environment outside.

DETAILED DESCRIPTION OF THE INVENTION

In the following, the technical solutions in the embodiments of the present invention will be clearly and fully described with reference to the drawings in the embodiments of the present invention. Obviously, the described embodiments are only a part of, not all of, the embodiments of the present invention. Based on the embodiments of the present invention, all other embodiments obtained by a person of ordinary skill in the art without creative efforts shall fall within the protection scope of the present invention.

The present invention provides a package structure with interconnection between chips and a packaging method thereof, and the packaging method of interconnection between chips includes the following steps.

Figure 1:
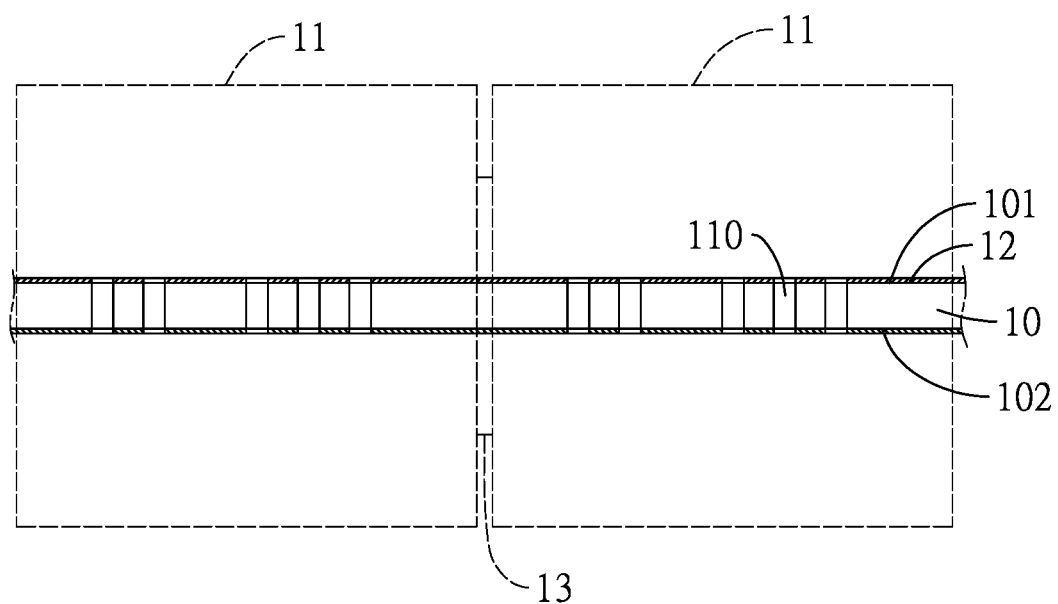
FIGS. 1-11 are flowcharts of the packaging method of interconnection between chips of the present invention.

With reference to FIG. 1, prepare a substrate 10. The substrate 10 has an upper surface 101 and a lower surface 102 opposite to each other. At least one daughter substrate unit 11 can be defined on the substrate 10. Preferably, multiple through holes 110 are formed on the daughter substrate unit 11 beforehand. For example, the multiple through holes 110 are formed on the daughter substrate unit 11 beforehand by way of mechanical drilling or laser drilling.

In one embodiment, multiple daughter substrate units 11 are defined on the substrate 10. Each of the multiple daughter substrate units 11 is arranged in a regular pattern, such as, but not limited to, a rectangular matrix. In addition, preferably, at least one cutting zone 13 is defined on the substrate 10, and the cutting zone 13 is between two adjacent daughter substrate units 11. In later steps, the forming of first wiring layers 21, second wiring layers 22 or mother substrate interconnecting bumps 23 (with reference to FIG. 2-FIG. 3B) is performed on each cutting zone 13 simultaneously, so that all daughter substrate units 11 are completed after being detached.

Figure 2:
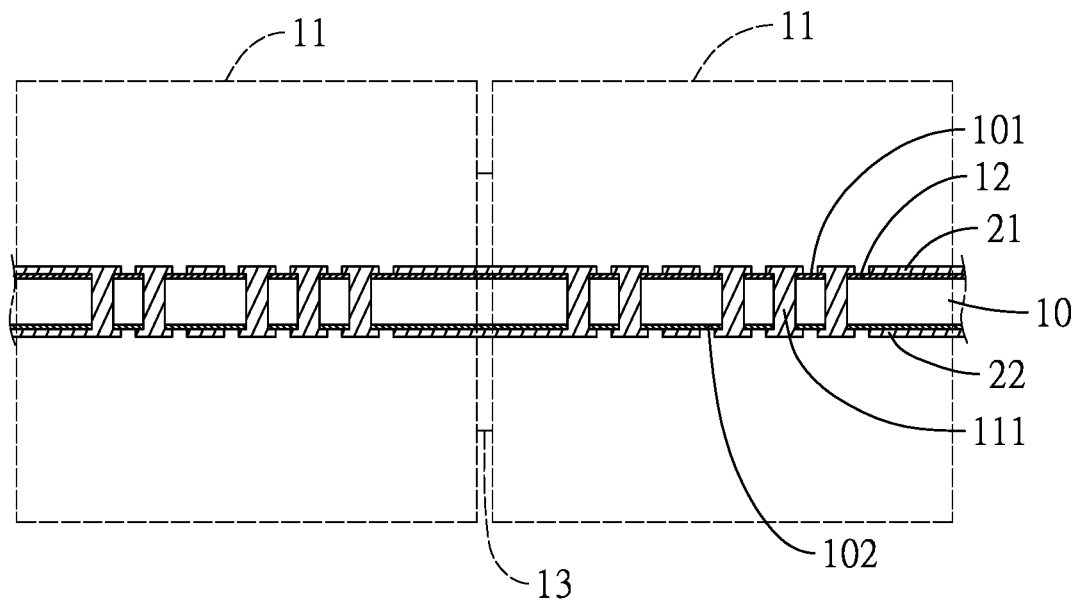

Please refer to FIG. 2. A first wiring layer 21 is formed on the upper surface 101 of the daughter substrate unit 11, and a second wiring layer 22 is formed on the lower surface 102 of the daughter substrate unit 11, and plated through holes 111 are formed in said multiple through holes 110. Accordingly, the first wiring layer 21 and the second wiring layer 22 can be connected through the plated through holes 111. Please refer to FIG. 1 as well. In one embodiment, seeding layers 12 are formed beforehand on both the upper surface 101 and the lower surface 102. The seeding layer 12 can be, for example, a copper layer; and the first wiring layer 21 and the second wiring layer 22 are respectively formed at the seeding layer 12 of the upper surface 101 and at the seeding layer 12 of the lower surface 102. For example, the first wiring layer 21 and the second wiring layer 22 are respectively formed by configuring patterned photoresist layers (for example through steps of photoresist coating, exposure and development) on the upper surface 101 and the lower surface 102 respectively, and then, performing steps of electroplating, and removal of the patterned photoresist layers.

Figure 3A:
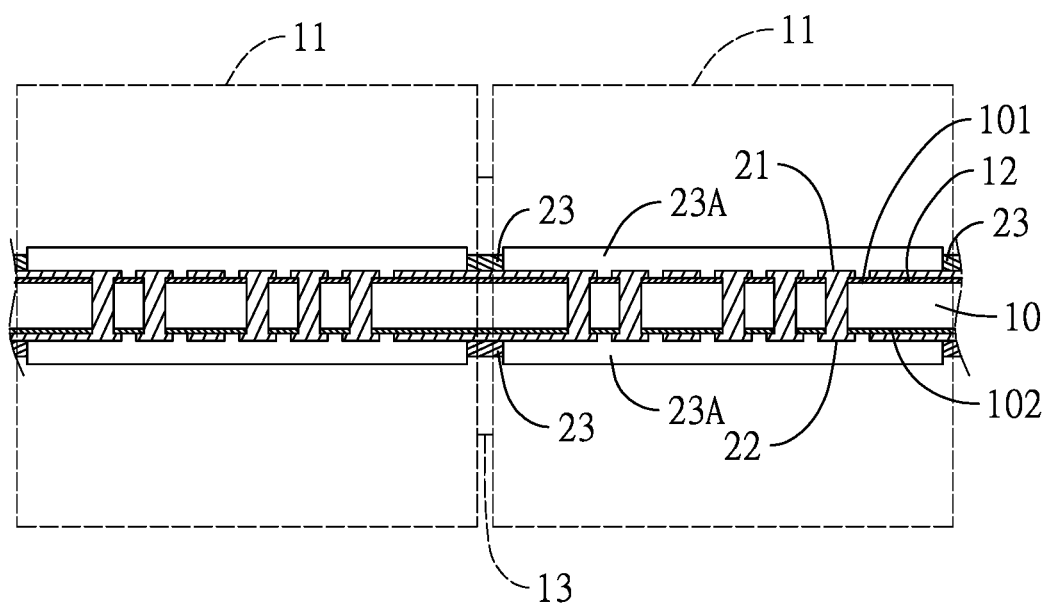

Please refer to FIG. 3A. When the first wiring layer 21, the second wiring layer 22 and the plated through holes 111 are completed, a mother substrate interconnecting bump 23 is further configured on the first wiring layer 21 and along a perimeter of the daughter substrate unit 11. In FIG. 3A, a patterned photoresist layer 23A is formed on the first wiring layer 21 by configuring a photoresist layer on the first wiring layer 21 and by subsequent exposure and development, such that an opening is formed on the patterned photoresist layer 23A at the perimeter of the daughter substrate unit 11, and then the mother substrate interconnecting bump 23 is formed in the opening by electroplating on the first wiring layer 21. Accordingly, the mother substrate interconnecting bump 23 is configured to stack on the first wiring layer 21. Preferably, multiple mother substrate interconnecting bumps 23 are configured on the first wiring layer 21, and similarly, multiple mother substrate interconnecting bumps 23 are also configured on the second wiring layer 22. The multiple mother substrate interconnecting bumps 23 are at the perimeter of the daughter substrate unit 11.

Figure 3B:
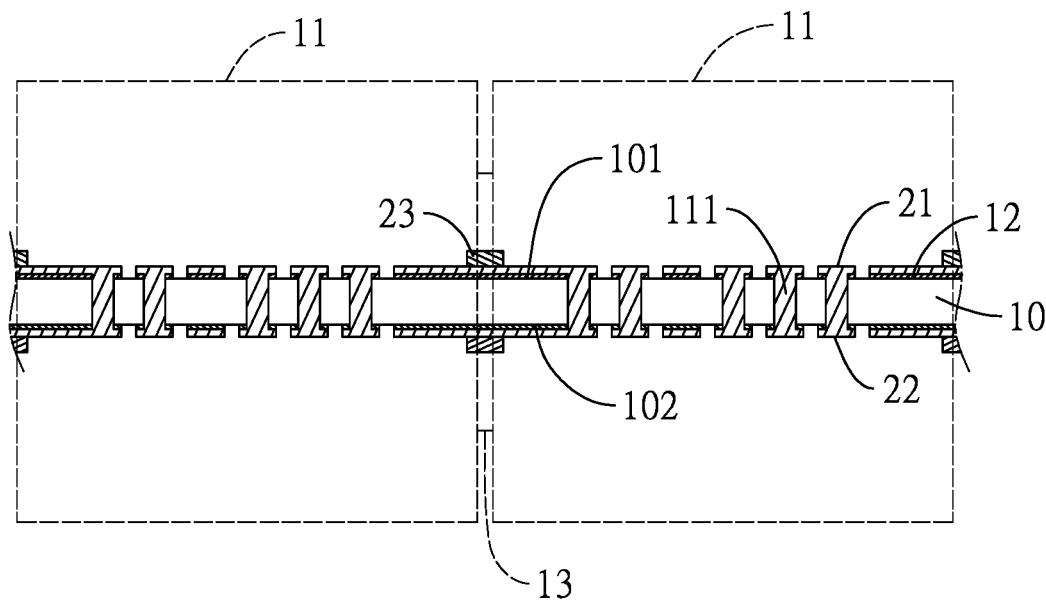

Please refer to FIG. 3B as well. Notice that in one embodiment of the present invention, after the mother substrate interconnecting bumps 23 are completed, portions of the seeding layers 12 not covered by the first wiring layer 21 and the second wiring layer 22 respectively on the upper surface 101 and the lower surface 102 of the substrate 10 are removed by etching. In other words, when the first wiring layer 21 and the second wiring layer 22 are configured on the seeding layers 12 on the upper surface 101 and the lower surface 102 respectively, the portions of the seeding layers 12 not covered by the first wiring layer 21 and the second wiring layer 22 are not etched away until the mother substrate interconnecting bumps 23 on the first wiring layer 21 or the second wiring layer 22 are completed, and the patterned photoresist layers 23A for forming the mother substrate interconnecting bumps 23 are removed, and thereafter, said portions of the seeding layers 12 are removed by, for example, etching. Wherein, the thicknesses of the mother substrate interconnecting bumps 23, the first wiring layer 21 and the second wiring layer 22 are thicker than that of the seeding layer 12, and accordingly, after etching away the seeding layer 12 of the substrate 10, the mother substrate interconnecting bumps 23, the first wiring layer 21 and the second wiring layer 22 will still remain.

Figure 4A:
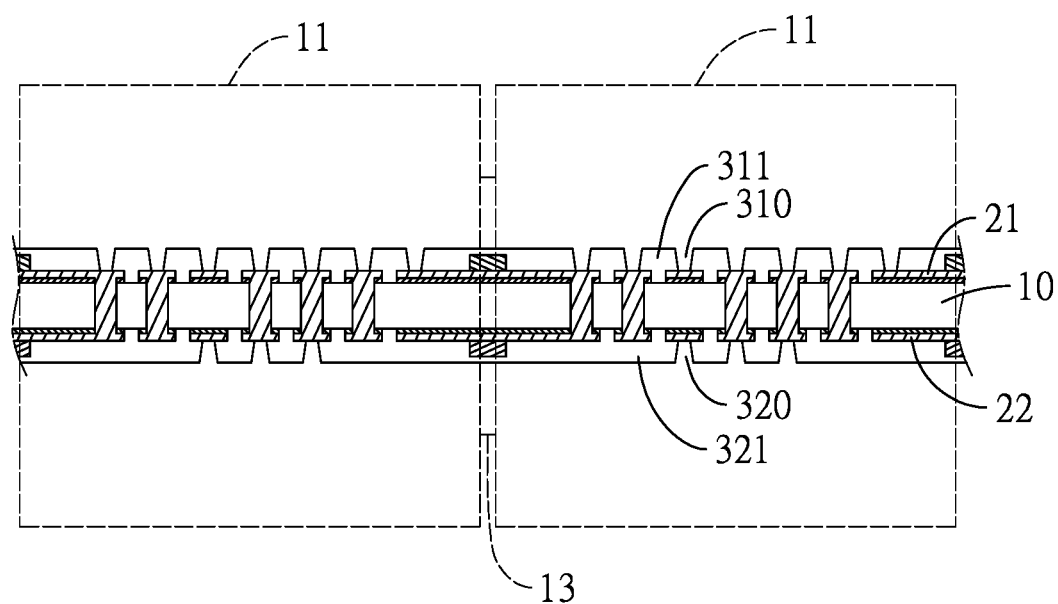
Figure 4B:
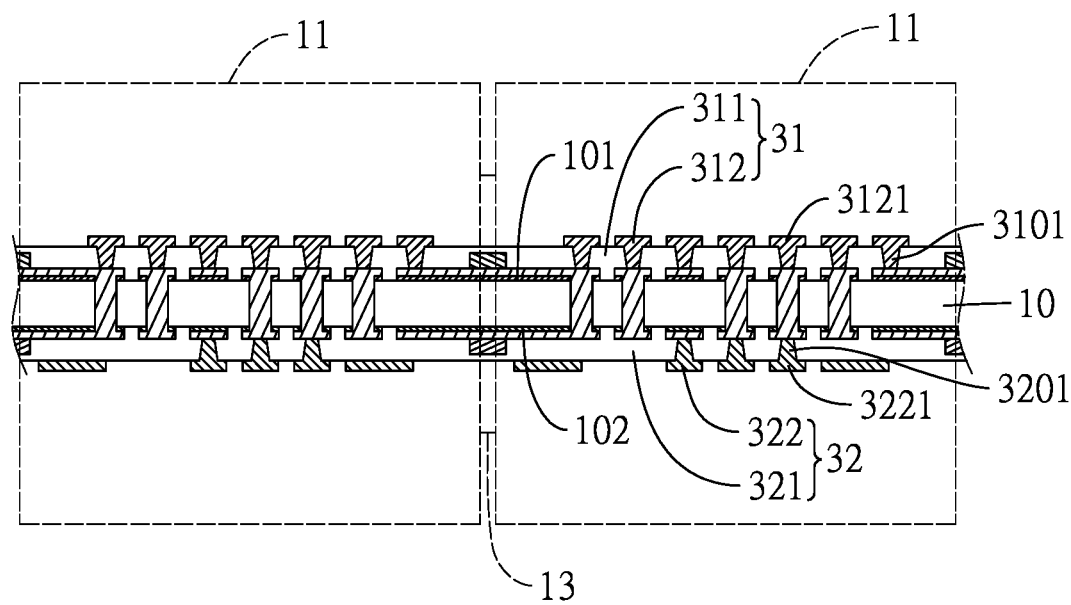

Please refer to FIGS. 4A-4B. In one embodiment, after the first wiring layer 21, the second wiring layer 22 and the mother substrate interconnecting bumps 23 are completed, a build-up wiring layer process is performed on both the first wiring layer 21 and the second wiring layer 22. Accordingly, a first build-up wiring layer structure 31 is stacked on the first wiring layer 21, and a second build-up wiring layer structure 32 is stacked on the second wiring layer 22. The first build-up wiring layer structure 31 and the second build-up wiring layer structure 32 respectively include at least one build-up wiring layer 312 and at least one build-up wiring layer 322. For example, in the drawings of the present invention, a single layer of the at least one build-up wiring layer is shown. The build-up wiring layer process, for example, includes the following steps: as shown in FIG. 4A, dielectric layers 311, 321 are respectively configured and set on the first wiring layer 21 and the second wiring layer 22, and then blind holes 310, 320 are respectively formed on the dielectric layers 311, 321 through laser drilling so that portions of the surfaces of the first wiring layer 21 and the second wiring layer 22 are exposed through the blind holes 310, 320. As shown in FIG. 4B, steps of photoresist coating, exposure, development, electroplating, removal of photoresist and etching are performed on the dielectric layers 311, 321 to form the build-up wiring layers 312, 322. Conductive materials are filled in the blind holes 310, 320 through electroplating to form plated conducting holes 3101, 3201 which are respectively between the build-up wiring layer 312 and the first wiring layer 21, and between the build-up wiring layer 322 and the second wiring layer 22. The plated conducting holes 3101 are for electrically connecting the build-up wiring layer 312 and the first wiring layer 21, and the plated conducting holes 3201 are for electrically connecting the build-up wiring layer structure 322 and the second wiring layer 22. In one embodiment, when the first build-up wiring layer structure 31 or the second build-up wiring layer structure 32 is the outermost surface wiring layer structure, the first build-up wiring layer 312 will include multiple first chip solder pads 3121 and the second build-up wiring layer 322 will include multiple second chip solder pads 3221.

Figure 5:
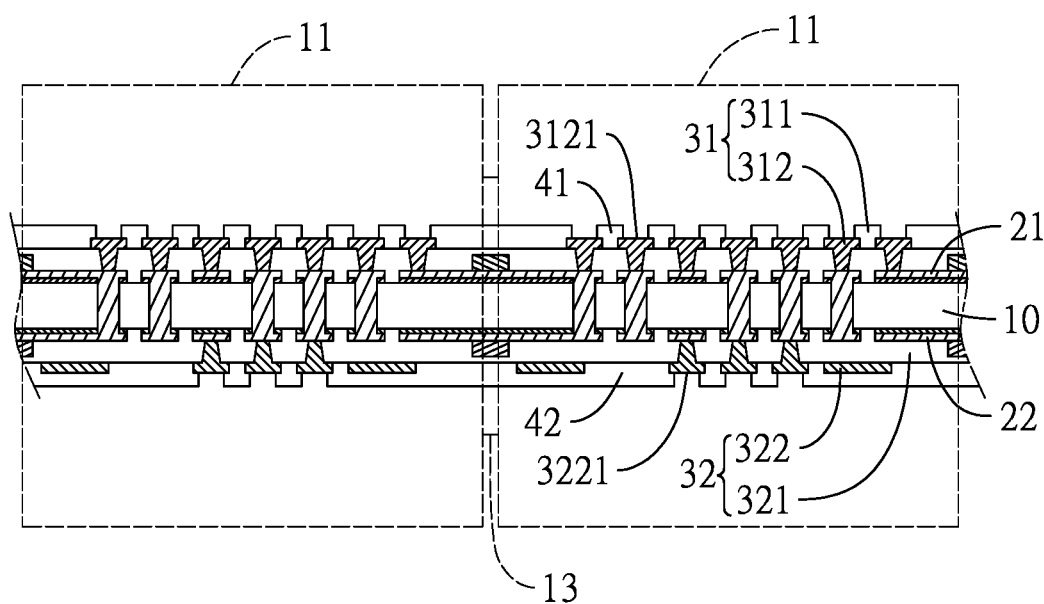

Please refer to FIG. 5. After the first build-up wiring layer structure 31 and the second build-up wiring layer structure 32 are completed, a first solder mask layer 41 is configured on the first build-up wiring layer structure 31, and a second solder mask layer 42 is configured on the second build-up wiring layer structure 32. The first solder mask layer 41 and the second solder mask layer 42 are respectively formed through processes of photoresist coating, exposure and development. Accordingly, the first solder mask layer 41 exposes the first chip solder pads 3121 and the second solder mask layer 42 exposes the second chip solder pads 3221.

Notice that the first build-up wiring layer structure 31 and the second build-up wiring layer structure 32 are optional, which means that the substrate 10 may only include the first wiring layer 21 and the second wiring layer 22. The first wiring layer 21 and the second wiring layer 22 respectively include chip solder pads for connecting the first chip and the second chip. In this embodiment, the first solder mask layer 41 and the second solder mask layer 42 are respectively and directly configured on the first wiring layer 21 and the second wiring layer 22, with the chip solder pads on the first wiring layer 21 and the second wiring layer 22 being exposed.

Figure 6A:
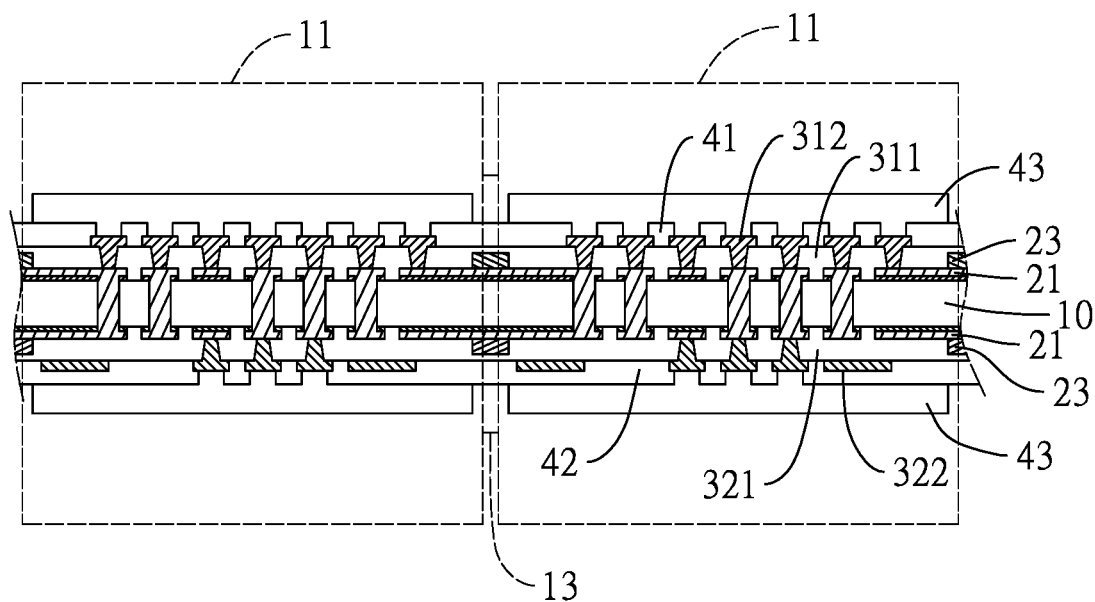
Figure 6B:
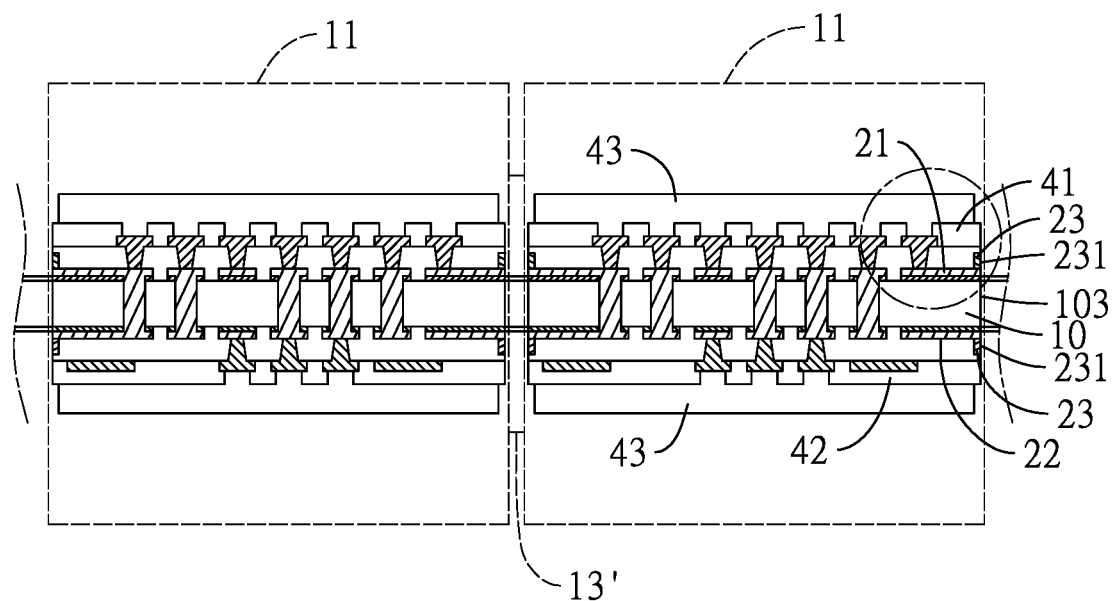

Please refer to FIGS. 6A-6B. After completing the steps for configuring the first solder mask layer 41 and the second solder mask layer 42, a cutting process is performed along the perimeter of the daughter substrate unit 11, so that a lateral face 231 of each mother substrate interconnecting bump 23 is exposed. Preferably, as shown in FIG. 6A, before performing the cutting process, a protection layer 43 is configured respectively on the first solder mask layer 41 and the second solder mask layer 42 of the daughter substrate unit 11. While performing the cutting process and subsequent processes for configuring solder layers 24, the protection layers 43 are to protect the daughter substrate unit 11's outermost layers of the solder mask layers, the wiring layers and the chip solder pads, etc., for example, the first build-up wiring layer structure 31, the second build-up wiring layer structure 32, the first chip solder pads 3121, the second chip solder pads 3221, the first solder mask layer 41 and the second solder mask layer 42, etc. The protection layer 43, for example, is a protective photoresist layer which is initially coated on the first solder mask layer 41 and the second solder mask layer 42, and then goes through exposure and development to expose the cutting zones. Afterwards, as shown in FIG. 6B, cutting is performed along the perimeter of the daughter substrate unit 11 to expose the lateral faces 231 of the mother substrate interconnecting bumps 23 which are placed at the perimeter of the daughter substrate unit 11.

Figure 6C:
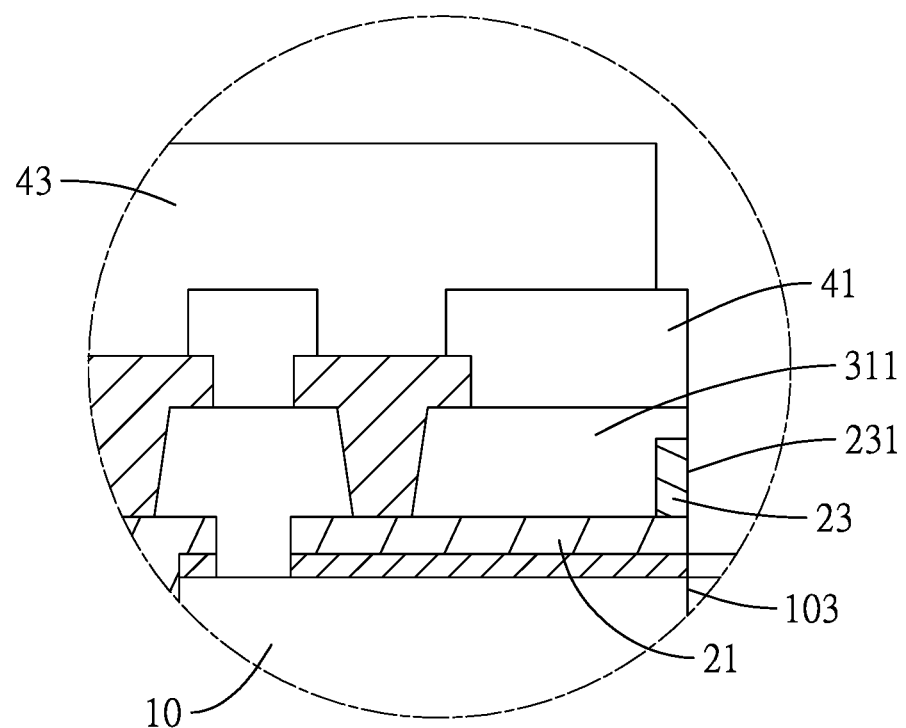

Please also refer to the partial enlargement view in FIG. 6C. After the cutting process is completed, the lateral faces 231 of the mother substrate interconnecting bumps 23 are aligned with the other material layers such as the substrate 10, the dielectric layers 311, 321, the first solder mask layer 41 or the second solder mask layer 42, etc. along a cutting plane 103 formed by the cutting process.

Figure 7:
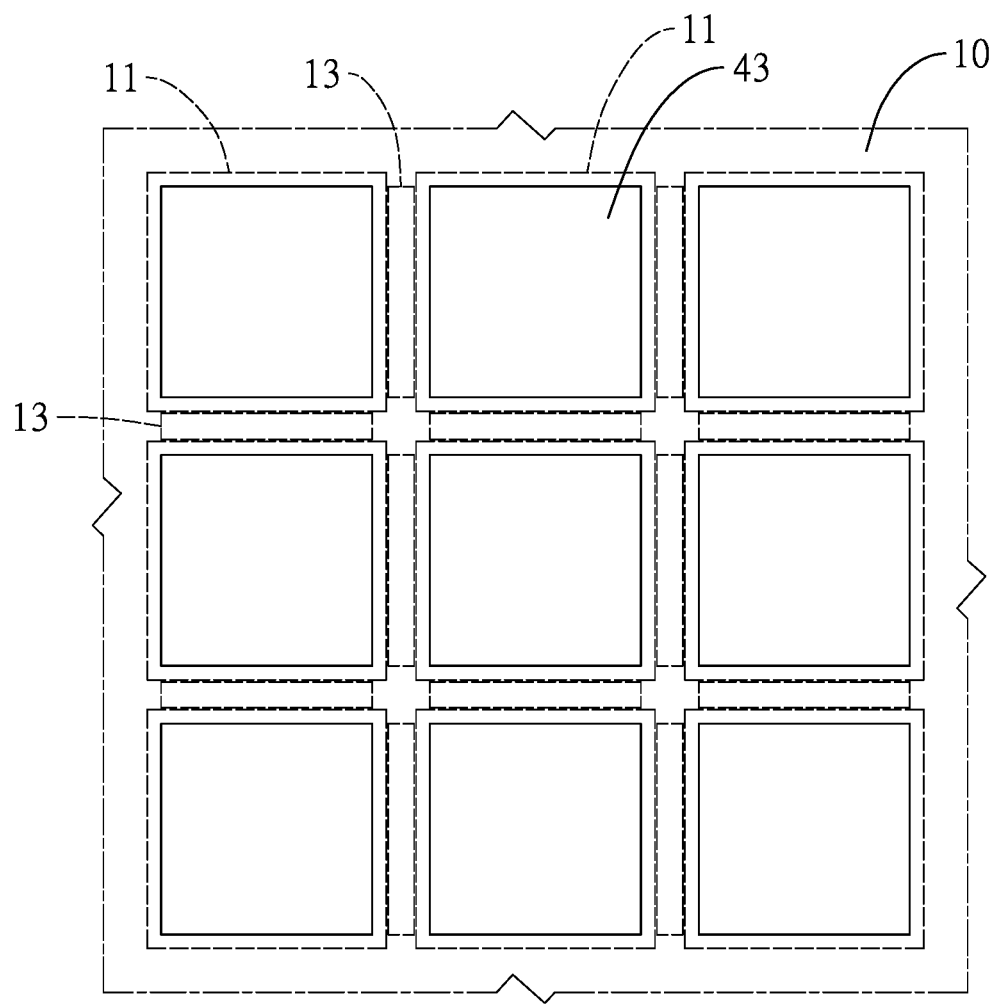

Please also refer to FIG. 7. FIG. 7 shows the top view of the substrate 10 before the cutting process. In one embodiment, each daughter substrate unit 11 on the substrate 10 has, for example, a rectangular shape which has two pairs of parallel sides, and the perimeter of the daughter substrate unit 11 could correspond, for example, to a single side or multiple sides of a rectangle. In one embodiment, multiple cutting zones 13 are defined on the substrate 10, and the multiple cutting zones 13 are configured at intervals between the perimeters of the daughter substrate units 11 which mean the multiple cutting zones 13 are each arranged between corresponding sides of two adjacent daughter substrate units 11. In this embodiment, during the cutting process and while cutting along the perimeters of the daughter substrate units 11 and within the cutting zones 13 of the substrate 10, materials of the first solder mask layer 41, the first build-up wiring layer structure 31, the second build-up wiring layer structure 32, the first wiring layer 21, the second wiring layer 22 and the substrate 10 inside the cutting zones 13, as well as materials of the portions of the mother substrate interconnecting bumps 23 extending into the cutting zones 13 are all removed, so as to form multiple hollowed-out cutting zones 13'. In this way, the lateral faces 231 of the mother substrate interconnecting bumps 23 are exposed towards the multiple hollowed-out cutting zones 13'.

Notice, in this embodiment, as shown in FIG. 7, preferably, the multiple cutting zones 13 are separated from each other, which means, the multiple cutting zones 13 are not connected to each other. Accordingly, after the cutting process step finishing cutting along the perimeters of the daughter substrate units 11 to form the multiple hollowed-out cutting zones 13', each daughter substrate unit 11 is still partially connected with adjacent daughter substrate units 11 without direct separation. Accordingly, at this moment, the substrate 10 is still in one piece which will facilitate each of the subsequent processes to process all the multiple daughter substrate units 11 at the same time.

Figure 8A:
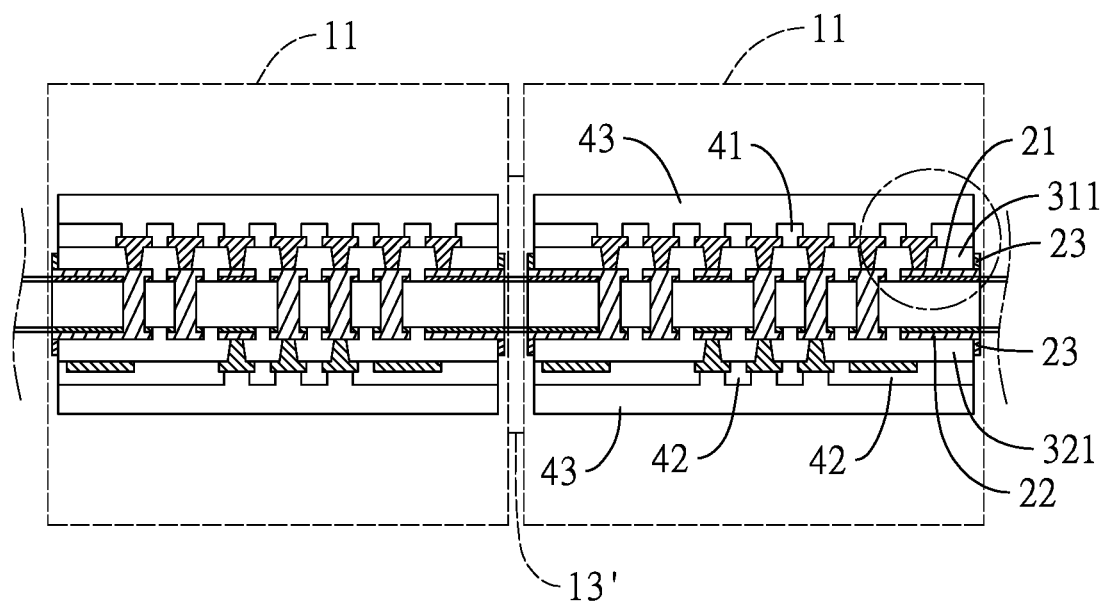
Figure 8B:
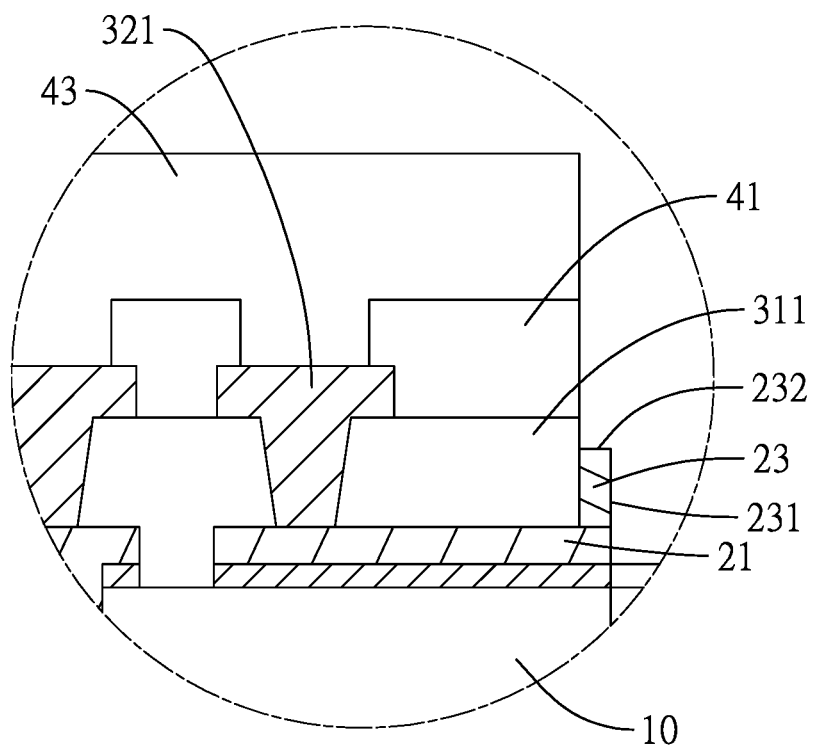
Figure 9A:
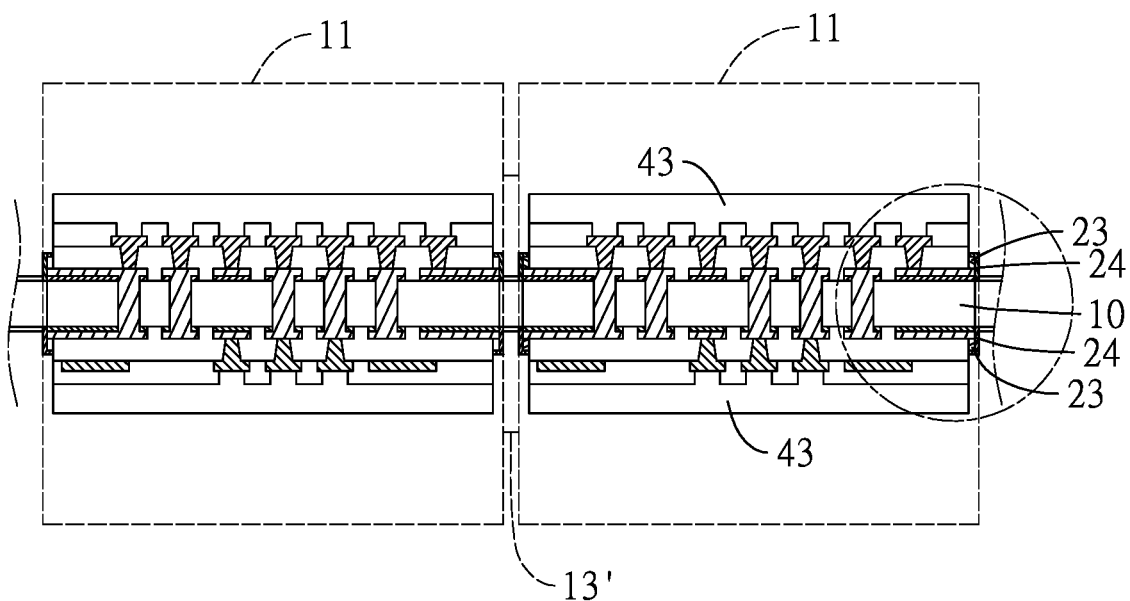
Figure 9B:
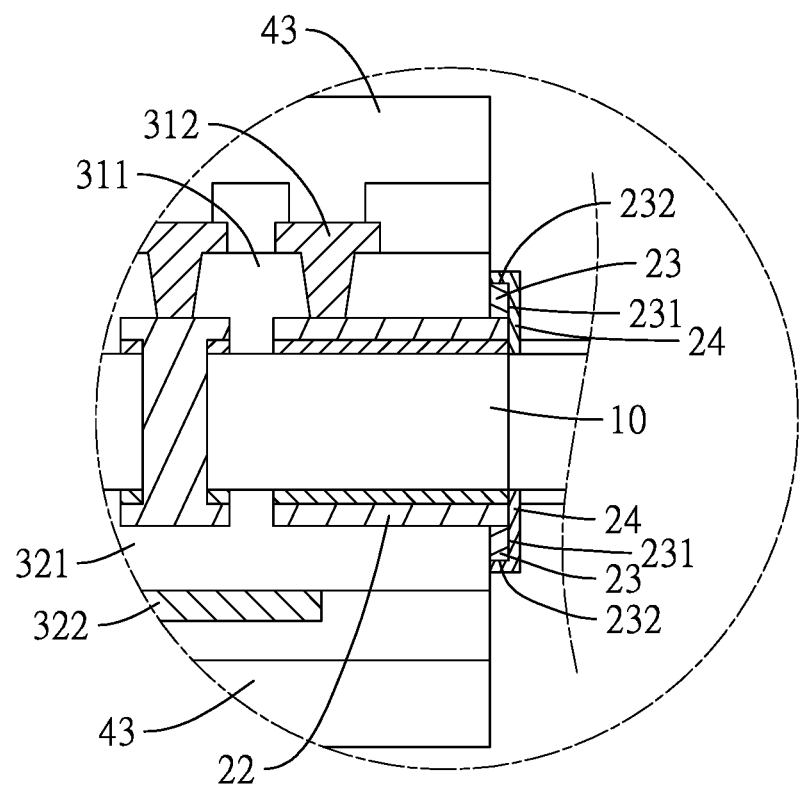

Please refer to the partial enlargement views in FIGS. 8A and 8B. In one embodiment, after the cutting process step finishing cutting along the perimeters of the daughter substrate units 11, portions of the first solder mask layer 41, the dielectric layers 311 of the first build-up wiring layer structure 31, second solder mask layer 42 and the dielectric layer 321 of the second build-up wiring layer structure 32, etc. are further removed, so as to expose the top faces 232 of the mother substrate interconnecting bumps 23. In other words, by removing portions of the material layers covering the mother substrate interconnecting bumps 23, the top faces 232 of the mother substrate interconnecting bumps 23 are exposed. In this process step, preferably, laser cutting is used to remove a fixed depth of those materials. In this way, when it comes to a step to configure a solder layer 24 on the lateral face 231 of the mother substrate interconnecting bump 23 (as shown in FIGS. 9A and 9B), the solder layer 24 extends from the lateral face 231 of the mother substrate interconnecting bump 23 to the top face 232 of the mother substrate interconnecting bump 23. This process step increases the exposed area of the mother substrate interconnecting bump 23 for the solder layer 24 to attach thereto. Accordingly, the quality and stability of the connections between the daughter carrier substrate 1 and a mother carrier substrate 6 are assured for the completed daughter carrier substrate 1.

Please refer to the partial enlargement views in FIGS. 9A and 9B. The lateral faces 231 of the mother substrate interconnecting bumps 23 are exposed after the cutting process step is completed. Then, a solder layer 24 is configured on the lateral face 231 of the mother substrate interconnecting bump 23. The material of the solder layer 24 is, for example, tin. For example, through an immersion tin process, the lateral face 231 and/or the top face 232 of the mother substrate interconnecting bump 23 are stained with tin. Since the substrate 10 is still in one piece, this process step, in one single process step, is able to complete the process of configuring the solder layer 24 on the lateral faces 231 of the multiple mother substrate interconnecting bumps 23 of the substrate 10.

Figure 10:
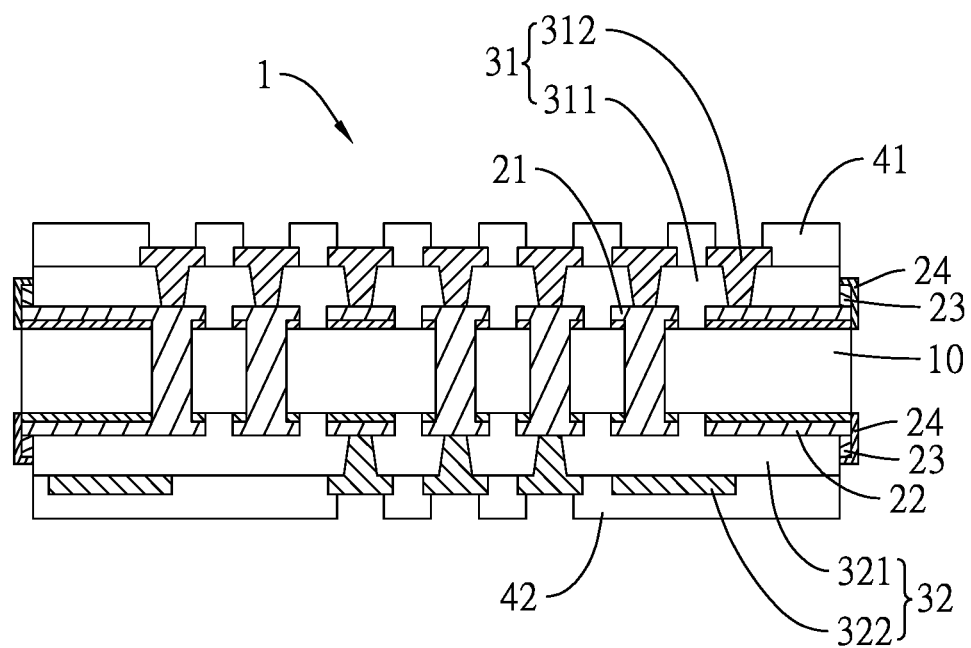

Please refer to FIG. 10. In one embodiment, after the solder layer 24 is configured on the lateral faces 231 and/or the top faces 232 of the mother substrate interconnecting bumps 23, the portions of the protection layers 43 outside of the daughter substrate units 11 are removed. Next, the daughter substrate units 11 are detached from other portions of the substrate 10 to become independent daughter carrier substrates 1. In this step, for example, portions of the substrate 10 other than the daughter substrate units 11 and the hollowed-out cutting zones 13' are removed by mechanical drilling or laser drilling processes to detach the daughter substrate units 11 from one another. A completed daughter carrier substrate 1 includes the substrate 10 within the daughter substrate unit 11 and the first wiring layer 21, the second wiring layer 22, the mother substrate interconnecting bumps 23, the first solder mask layer 41, the second solder mask layer 42, or further includes the first build-up wiring layer structure 31 and the second build-up wiring layer structure 32, etc. thereon.

Figure 11:
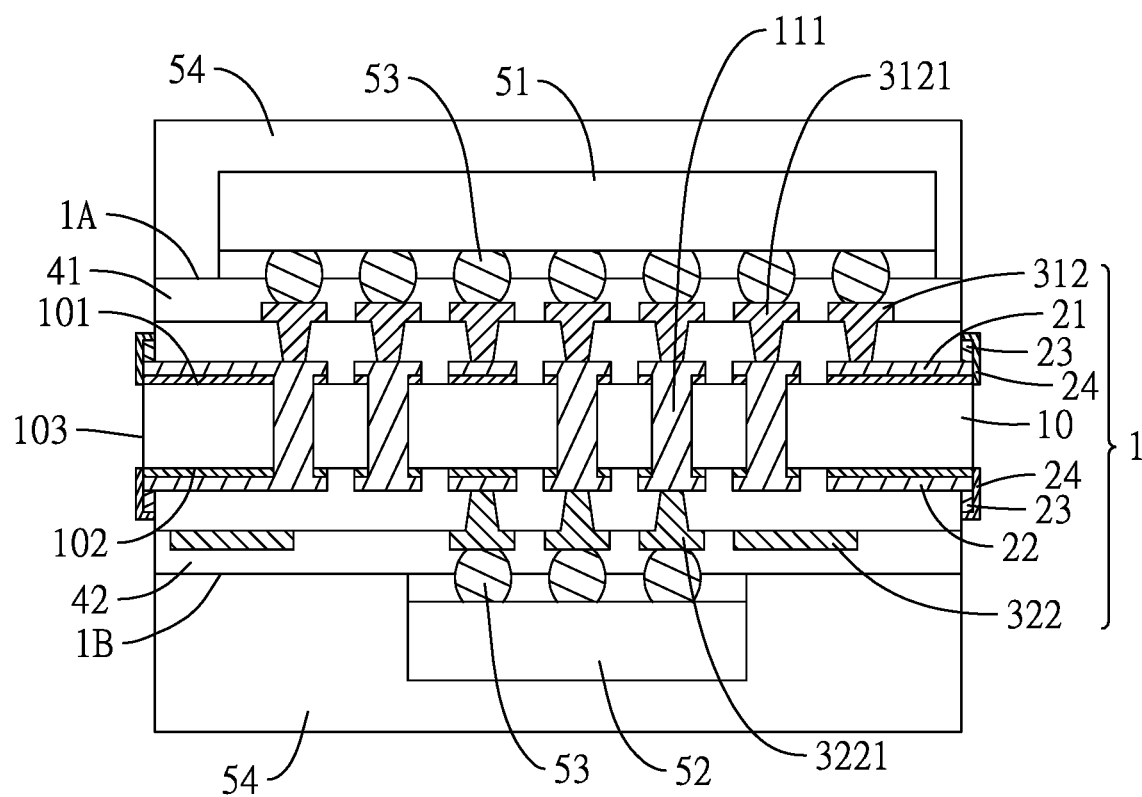

Please refer to FIG. 11. After the detachment of the daughter substrate unit 11, a first chip 51 is configured on the first wiring layer 21, and a second chip 52 is configured on the second wiring layer 22 of the daughter substrate unit 11, and the first chip 51 is electrically connected to the second chip 52 through the first wiring layer 21, the second wiring layer 22 and the plated through holes 111. In this process step, when the daughter substrate unit 11 has only the first wiring layer 21 and the second wiring layer 22, for example, by connecting the multiple chip solder pads of the first wiring layer 21 with the first chip 51 and connecting the multiple chip solder pads of the second wiring layer 22 with the second chip 52, the first chip 51 is electrically and signally connected to the second chip 52 through the first wiring layer 21, the second wiring layer 22 and the plated through holes 111. Or, as shown in FIG. 11, the first chip 51 is connected to the first chip solder pads 3121 of the first build-up wiring layer structure 31 by solder 53, and the second chip 52 is connected to the second chip solder pads 3221 of the second build-up wiring layer structure 32 by solder 53. Electric connections between the first chip 51 and the second chip 52 are formed through the build-up wiring layers 312, 322 respectively in the first build-up wiring layer structure 31 and the second build-up wiring layer structure 32, and then through the first wiring layer 21 and the second wiring layer 22. The present invention is not limited to this embodiment. Preferably, after completing the soldering respectively between the daughter substrate unit 11 and the first chip 51, the second chip 52, an insulated encapsulation layer 54, for example a layer of encapsulating resin, is formed to cover the first chip 51 and the second chip 52 as protection.

Please refer to FIG. 11. A package structure with interconnection between chips made according to the packaging method of interconnection between chips of the present invention, mainly includes the daughter carrier substrate 1, the first chip 51, the second chip 52 and the solder layer 24. The daughter carrier substrate 1 includes multiple wiring layers, for example the first wiring layer 21 and the second wiring layer 22, or further includes the first build-up wiring layer 312 and the second build-up wiring layer 322, etc. The daughter carrier substrate 1 includes a first surface 1A and a second surface 1B opposite to the first surface 1A. The first surface 1A is, for example, the surface of the solder mask layer 41 configured as the outermost layer of the at least one wiring layer on the upper surface 101 of the substrate 10, and the second surface 1B is, for example, the surface of the solder mask layer 42 configured as the outermost layer of the at least one wiring layer on the lower surface 102 of the substrate 10. The daughter carrier substrate 1 further includes at least one mother substrate interconnecting bump 23 which is configured on one of the wiring layers and on the perimeter of the daughter carrier substrate 1. A lateral face 231 of the mother substrate interconnecting bump 23 is exposed towards the outside of the daughter carrier substrate 1, and the solder layer 24 is configured on the lateral face 231 of the mother substrate interconnecting bump 23. The first chip 51 is configured on the first surface 1A of the daughter carrier substrate 1, and forms electrical connections with the wiring layers on the first surface 1A of the daughter carrier substrate 1, for example, such electrical connections are formed by soldering the first chip solder pad 3121 of the build-up wiring layer 321 with the solder 53. The first chip 52 is configured on the second surface 1B of the daughter carrier substrate 1, and forms electrical connections with the wiring layers on the second surface 1B of the daughter carrier substrate 1, for example, such electrical connections are formed by soldering the second chip solder pad 3221 of the build-up wiring layer 322 with the solder 53. The first chip 51 and the second chip 52 are electrically connected through the multiple wiring layers. Preferably, the electrical connection between the first chip 51 and the second chip 52 means signal connection.

In one embodiment, since the lateral faces of the mother substrate interconnecting bumps 23 are formed by cutting through the entire structure of the daughter substrate unit 11's perimeter, the lateral face of the mother substrate interconnecting bump 23 is aligned with a cutting plane 103 of the substrate 10.

In one embodiment, the packaging method of interconnection between chips of the present invention further includes the following step to connect the daughter carrier substrate 1 which is already connected with the first chip 51 and the second chip 52, with the mother carrier substrate 6.

Figure 12A:
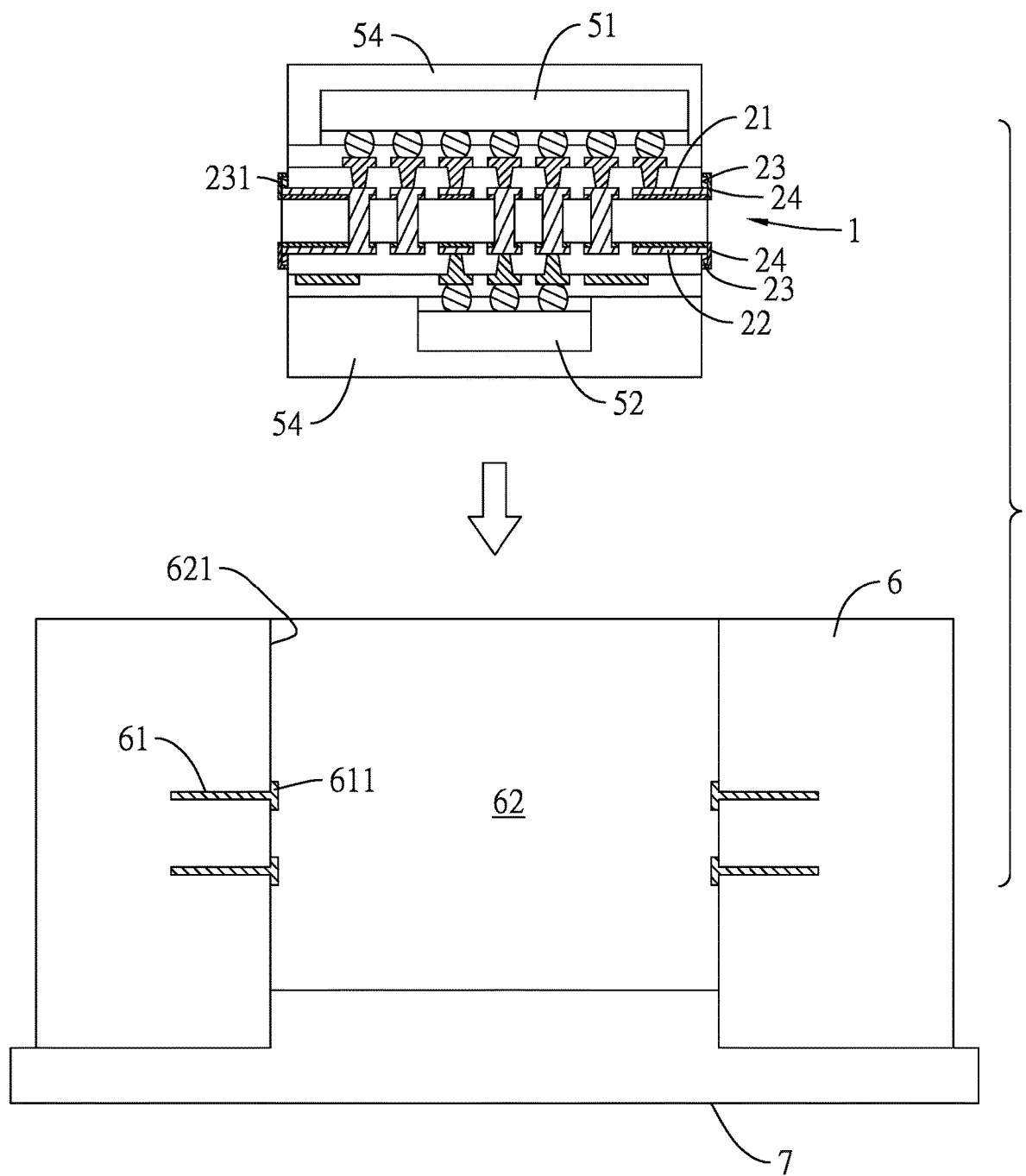
FIGS. 12A-12D are flowcharts of an embodiment of the packaging method of interconnection between chips of the present invention.

Please refer to the FIG. 12A. Prepare a mother carrier substrate 6 which includes multiple wiring layers 61 and a daughter carrier substrate accommodating slot 62. The daughter carrier substrate accommodating slot 62 includes a sidewall 621. The multiple wiring layers 61 include at least one lateral face contact 611 protruding from the sidewall 621 and being exposed to the outside. The daughter substrate unit 11 mounted with the first chip 51 and the second chip 52 is inserted in the daughter carrier substrate accommodating slot 62. And the perimeter of the daughter substrate unit 11 is facing the sidewall 621 of the daughter carrier substrate accommodating slot 62. In one embodiment, the mother carrier substrate 6 is handled by a dedicated jig 7 to stabilize the relative position of the mother carrier substrate 6 and the daughter carrier substrate 1 and thereby to achieve the purpose of aligning the lateral face contacts of the mother carrier substrate 6 with the mother substrate interconnecting bumps 23 of the daughter carrier substrate 1.

Figure 12B:
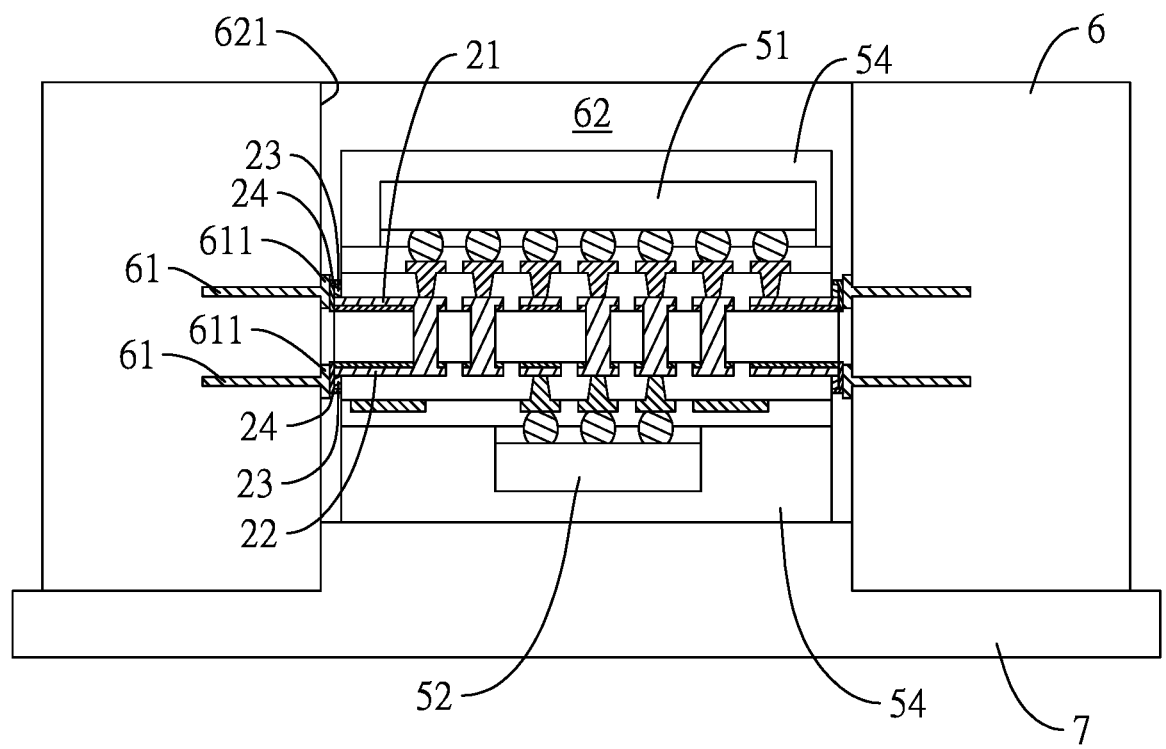

Please refer to FIG. 12B. After the daughter substrate unit 11 mounted with the first chip 51 and the second chip 52 is inserted in the daughter carrier substrate accommodating slot 62, the mother substrate interconnecting bumps 23 are connected with the lateral face contacts 611 of the mother carrier substrate 61 through the solder layer 24. In this way, the wiring layers of the daughter carrier substrate 1, such as the first wiring layer 21 and the second wiring layer 22, are electrically connected with the wiring layer 61 of the mother carrier substrate through the mother substrate interconnecting bumps 23.

Figure 12C:
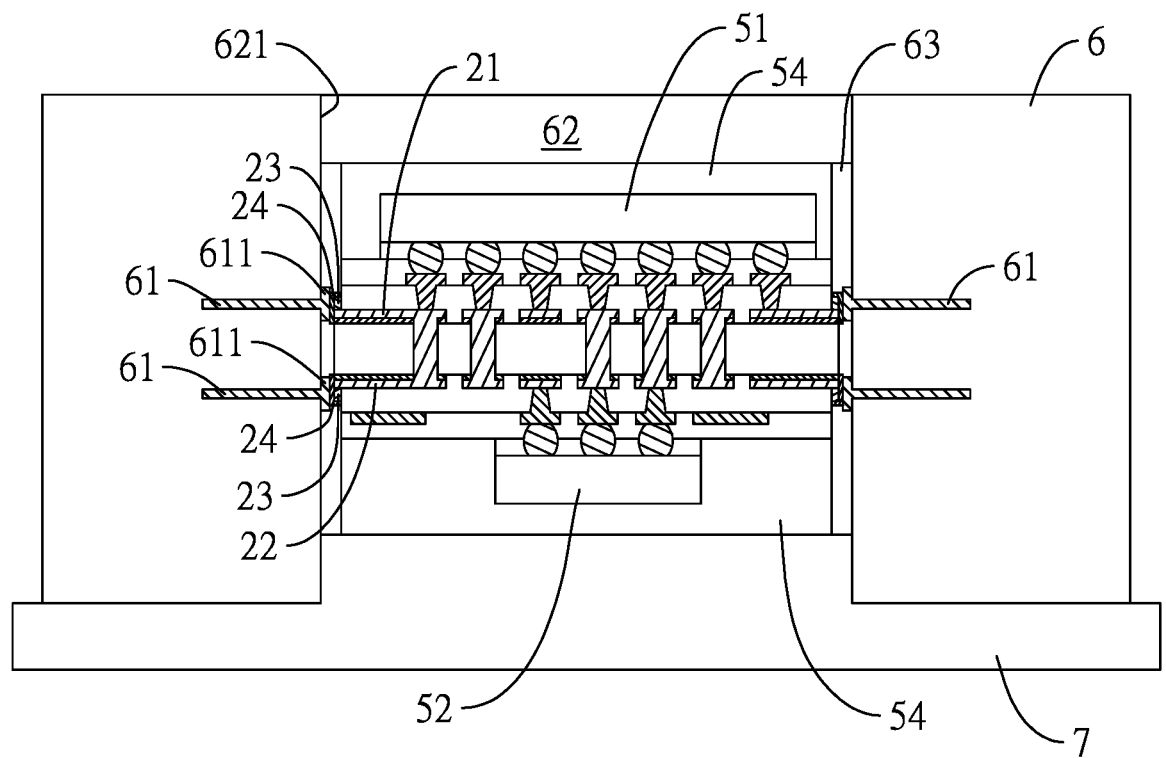
Figure 12D:
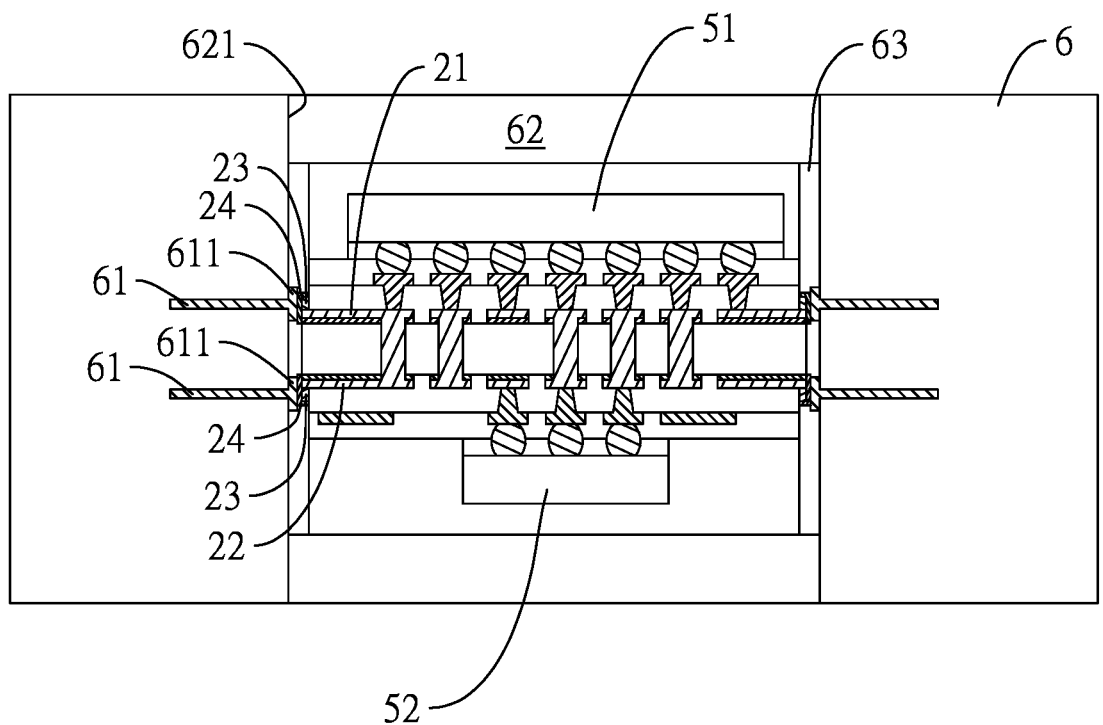

In one embodiment, as shown in FIG. 12C, after completing the connections between the daughter carrier substrate 1 and the mother carrier substrate 6, perform a filling process for the daughter carrier substrate accommodating slot 62 of the mother carrier substrate 6 to fill the gaps among the daughter carrier substrate 1, the first chip 51, the second chip 52, and the sidewall 621 of the daughter carrier substrate accommodating slot 62 with filler material 63. Finally, as shown in FIG. 12D, the mother carrier substrate 6 with the daughter carrier substrate 1 is released from a dedicated jig (not shown in drawings) to complete mutual signal connections between the first chip 51 and the second chip 52 through the daughter carrier substrate 1 and further through the package structure connecting the daughter carrier substrate 1 and the wiring layer 61 of the mother carrier substrate 6.

Figure 13:
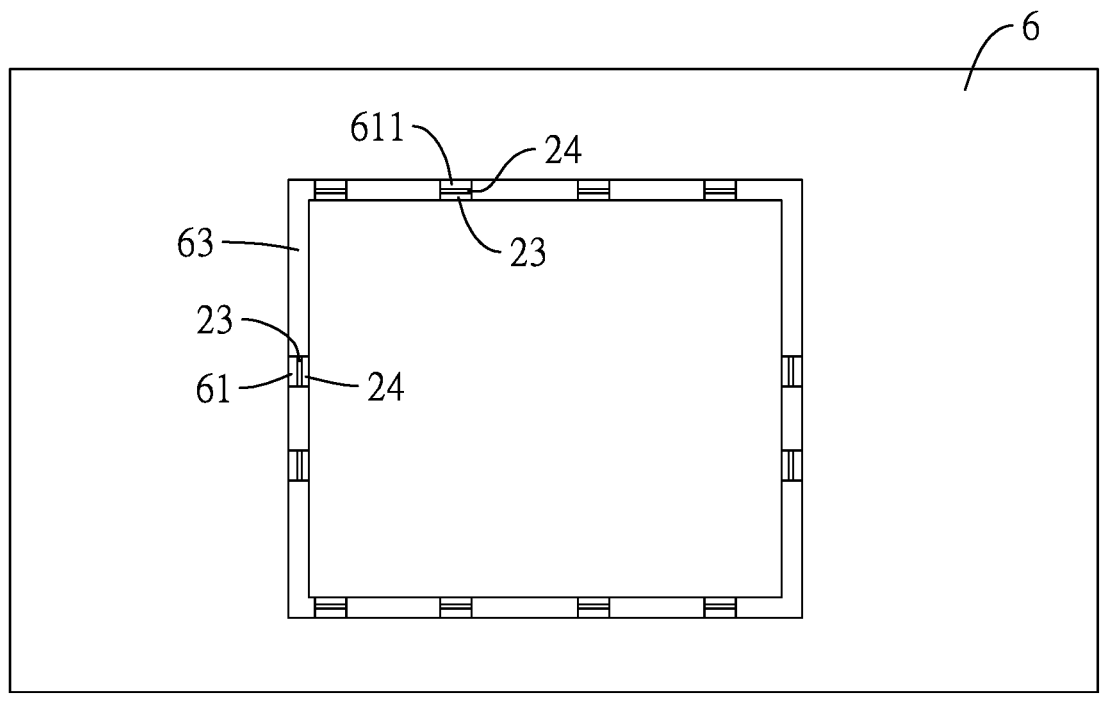
FIG. 13 is a top view of an embodiment of the packaging method of interconnection between chips of the present invention.

Please refer to the top view schematics of FIG. 13. The daughter carrier substrate 1 mounted with the first chip 51 and the second chip 52 is configured in the accommodating slot of the mother carrier substrate by way of insertion. The wiring layers of the daughter carrier substrate 1, such as the first wiring layer 21 and the second wiring layer 22 are connected with the lateral face contacts 611 of the mother carrier substrate 6 through the mother substrate interconnecting bumps 23 which are on the perimeter of the daughter carrier substrate 1. The signals transmitted between the daughter carrier substrate 1 and the mother carrier substrate 6 are transmitted along a horizontal direction which, for example, includes the directions of the X-axis and the Y-axis as shown in FIG. 13. In the prior art of chip interconnection packaging technologies, the daughter carrier substrate is configured on an upper surface of a mother carrier substrate with surface contacts, and the daughter carrier substrate has to go through vertical plated conducting holes to connect with the internal wiring layers of the mother carrier substrate. Whereas, in the present invention, the number of times of the signals which are transmitted between the daughter carrier substrate 1 and the mother carrier substrate 6, passing vertically through the plated conducting holes, is lesser compared with that of the prior arts; in this way, the reflection losses of the signals when passing through the conducting holes are lower. Hence the quality of signals transmitted between the daughter carrier substrate 1 and the mother carrier substrate 6 is enhanced.

Figure 14:
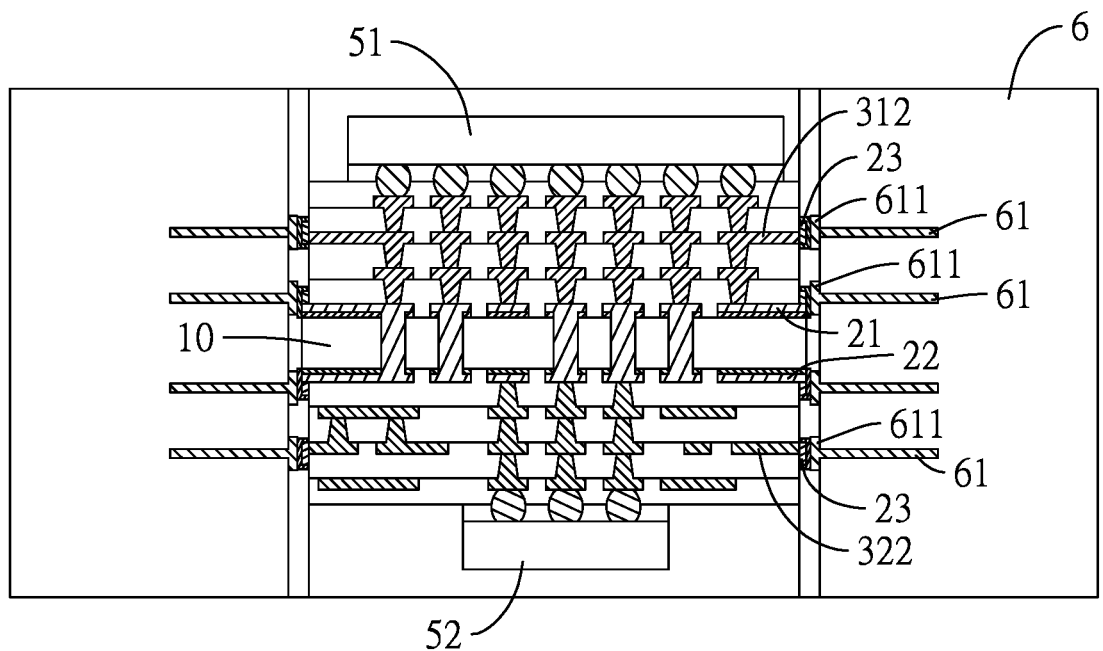
FIG. 14 is a sectional view of an embodiment of the packaging method of interconnection between chips of the present invention.
Figure 15:
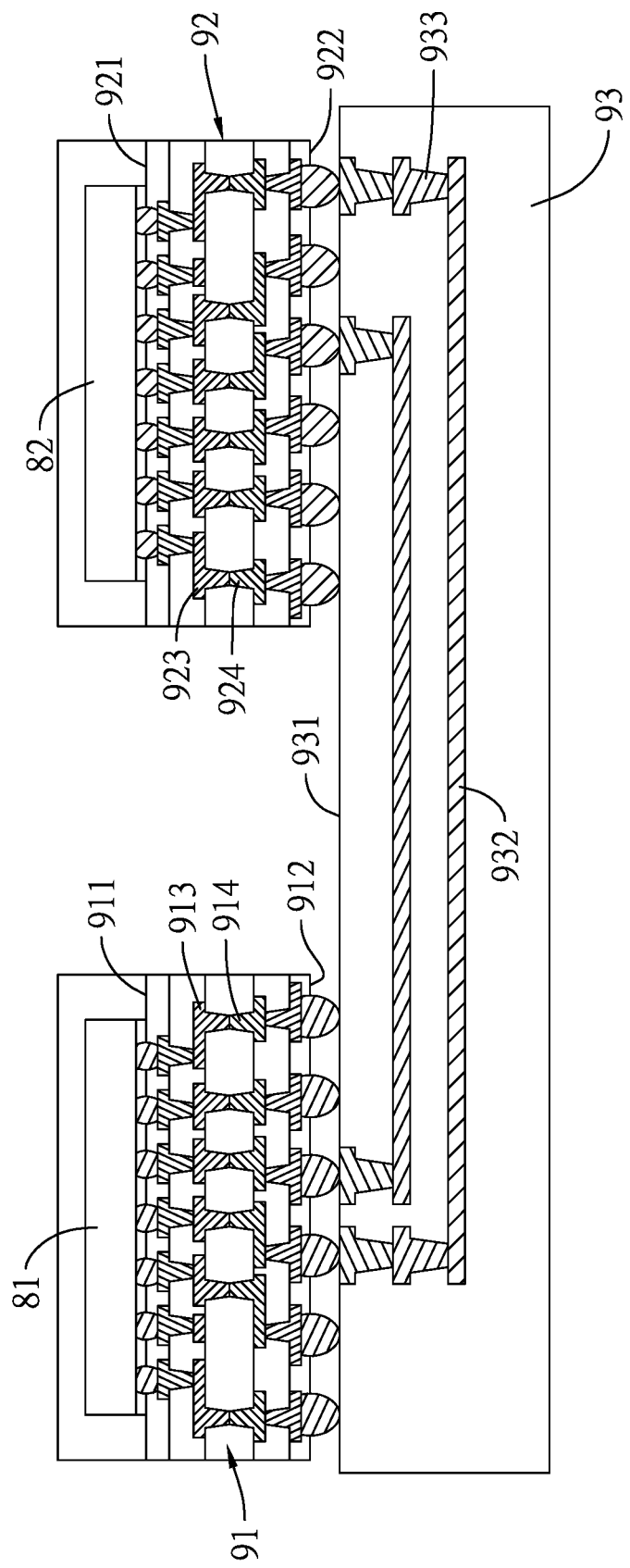
FIG. 15 is a sectional view of a current package structure with interconnection between chips in accordance with the prior art.

Please refer to FIG. 14. In one embodiment, the mother substrate interconnecting bumps 23 may be configured on multiple wiring layers which are not limited to the first wiring layer 21 and the second wiring layer 23. After the completion of the configuration of any one of the build-up wiring layers 312, 322 on the daughter carrier substrate, the mother substrate interconnecting bumps 23 can be configured thereon. And lateral face contacts 611 of the wiring layers 61 are configured at corresponding locations in the daughter carrier substrate accommodating slots 62 of the mother carrier substrate 6, and in this way, the build-up wiring layers 312, 322 of the daughter carrier substrate 1 connect with each wiring layer 61 of the mother carrier substrate 6, directly through the mother substrate interconnecting bumps 23. Accordingly, any wiring layer in the daughter carrier substrate 1, for example, the first wiring layer 21, the second wiring layer 22 or build-up wiring layers 312, 322 can connect the targeted wiring layers in the mother carrier substrate without going through the at least one plated through hole to firstly electrical connect with the surface contacts of the daughter carrier substrate surface and then going through the surface contacts of a mother carrier substrate and the at least one plated through hole of the mother carrier substrate. Hence, the signal transmission paths between the wiring layers in the daughter carrier substrate 1 and the wiring layers in the mother carrier substrate 6 are shortened and the quality of signal connections is enhanced.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A packaging method of interconnection between chips, including the following steps:
    preparing a substrate having an upper surface and a lower surface; and the substrate including a daughter substrate unit having multiple through holes;
    forming a first wiring layer on a first surface of the daughter substrate unit, and forming a second wiring layer on a second surface of the daughter substrate unit, and forming plated through holes in the through holes of the daughter substrate unit, and connecting the first wiring layer electrically with the second wiring layer through the plated through holes;
    configuring a mother substrate interconnecting bump on the first wiring layer, wherein the mother substrate interconnecting bump is configured at a perimeter of the daughter substrate unit; and
    performing a cutting procedure along the perimeter of the daughter substrate unit to expose a lateral face of the mother substrate interconnecting bump.

2. The packaging method of interconnection between chips as claimed in claim 1, including the following step:
    configuring a solder layer on a lateral face of the mother substrate interconnecting bump.

3. The packaging method of interconnection between chips as claimed in claim 2, including the following step:
    configuring a first chip on the first wiring layer of the daughter substrate unit, and configuring a second chip on the second wiring layer of the daughter substrate unit, wherein, the first chip electrically connects with the second chip through the first wiring layer, the second wiring layer and each of the plated through holes.

4. The packaging method of interconnection between chips as claimed in claim 2, including the following steps:
    performing build-up wiring layer processes on the first wiring layer and the second wiring layer to respectively configure a first build-up wiring layer structure on the first wiring layer and a second build-up wiring layer structure on the second wiring layer;
    configuring a first solder mask layer and a second solder mask layer respectively on the first build-up wiring layer structure and the second build-up wiring layer structure, and the first solder mask layer exposing multiple first chip solder pads of the first build-up wiring layer structure, and the second solder mask layer exposing multiple second chip solder pads of the second build-up wiring layer structure.

5. The packaging method of interconnection between chips as claimed in claim 4, including the following steps:
    removing portions of the first solder mask layer and the first build-up wiring layer structure along the perimeter of the daughter substrate unit to expose a top face of the mother substrate interconnecting bump; wherein,
    in the step of configuring a solder layer on a lateral face of the mother substrate interconnecting bump, the solder layer extends from the lateral face of the mother substrate interconnecting bump to the top face of the mother substrate interconnecting bump.

6. The packaging method of interconnection between chips as claimed in claim 1, including the following steps:
    forming a seeding layer beforehand on the upper surface and the lower surface of the substrate; and after completing the step of configuring a mother substrate interconnecting bump on the first wiring layer, the method further including:
    removing portions of the seeding layer not covered by the first wiring layer and the second wiring layer.

7. The packaging method of interconnection between chips as claimed in claim 1, wherein, the substrate includes multiple daughter substrate units, and each of the multiple daughter substrate units is arranged periodically.

8. The packaging method of interconnection between chips as claimed in claim 7, wherein, the substrate further includes multiple cutting zones, and each of the multiple cutting zones is arranged between corresponding sides of two adjacent said daughter substrate units;
    in the step of performing the cutting procedure along the perimeter of the daughter substrate unit to expose the lateral face of the mother substrate interconnecting bump, all the materials in each of the multiple cutting zones are removed to expose the lateral face of the mother substrate interconnecting bump towards the cutting zone.

9. The packaging method of interconnection between chips as claimed in claim 2, wherein, before the step of performing the cutting procedure along the perimeter of the daughter substrate unit to expose the lateral face of the mother substrate interconnecting bump, the following steps are further included:
    covering the first wiring layer and the second wiring layer respectively with a protection layer; and
    after completing the step of configuring a solder layer on a lateral face of the mother substrate interconnecting bump, the following step is further included:
    removing the protection layer on the first wiring layer and the second wiring layer.

10. The packaging method of interconnection between chips as claimed in claim 3, after completing the step of configuring a solder layer on a lateral face of the mother substrate interconnecting bump, the following step is further included:
    detaching the daughter substrate unit from other portions of the substrate to complete an independent daughter carrier substrate, wherein, the first chip and the second chip are configured on the daughter carrier substrate.

11. The packaging method of interconnection between chips as claimed in claim 10, further including the following steps:
    preparing a mother carrier substrate which includes multiple wiring layers, and a daughter carrier substrate accommodating slot; the daughter carrier substrate accommodating slot including a sidewall, and a lateral face contact of the multiple wiring layers protruding from the sidewall;
    inserting the daughter carrier substrate mounted with the first chip and the second chip into the daughter carrier substrate accommodating slot, so that the lateral face of the mother substrate interconnecting bump faces towards the sidewall of the daughter carrier accommodating slot; and
    connecting the mother substrate interconnecting bump with the lateral face contact of the mother carrier substrate through the solder layer.

12. A package structure with interconnection between chips, including:

a daughter carrier substrate including a substrate, wiring layers and a mother substrate interconnecting bump, and the daughter carrier substrate having a first surface and a second surface opposite to the first surface; the mother substrate interconnecting bump being configured on a wiring layer of the multiple wiring layers and on a perimeter of the daughter carrier substrate, and a lateral face of the mother substrate interconnecting bump being exposed towards the outside of the daughter carrier substrate.

13. The package structure with interconnection between chips as claimed in claim 12, further including:
a solder layer configured on the lateral face of the mother substrate interconnecting bump.

14. The package structure with interconnection between chips as claimed in claim 13, wherein,
the mother substrate interconnecting bump has a top face, and the solder layer extends from the lateral face of the mother substrate interconnecting bump to the top face of the mother substrate interconnecting bump.

15. The package structure with interconnection between chips as claimed in claim 13, further including:
a first chip, configured on the first surface of the daughter carrier substrate, and electrically connected with a wiring layer of the first surface; and
a second chip, configured on the second surface of the daughter carrier substrate, and electrically connected with a wiring layer of the second surface; and the first chip electrically connected with the second chip through the wiring layers.

16. The package structure with interconnection between chips as claimed in claim 14, further including:
a first chip, configured on the first surface of the daughter carrier substrate, and electrically connected with a wiring layer of the first surface; and
a second chip, configured on the second surface of the daughter carrier substrate, and electrically connected with a wiring layer of the second surface; and the first chip electrically connected with the second chip through the wiring layers.

17. The package structure with interconnection between chips as claimed in claim 15, further including:
a mother carrier substrate, including wiring layers, and having a daughter carrier substrate accommodating slot; the daughter carrier substrate accommodating slot penetrating at least two wiring layers of the multiple wiring layers; the daughter carrier substrate accommodating slot having a sidewall, and structures of the multiple wiring layers including a lateral face contact protruding from the sidewall;
wherein the daughter carrier substrate, the first chip and the second chip are configured in the daughter carrier substrate accommodating slot, and the lateral face of the mother substrate interconnecting bump faces towards the sidewall of the daughter carrier substrate accommodating slot, and the mother substrate interconnecting bump of the daughter carrier substrate connects with the lateral face contact of the mother carrier substrate through the solder layer on the lateral face.

18. The package structure with interconnection between chips as claimed in claim 16, further including:
a mother carrier substrate, including wiring layers, and having a daughter carrier substrate accommodating slot; the daughter carrier substrate accommodating slot penetrating at least two wiring layers of the multiple wiring layers; the daughter carrier substrate accommodating slot having a sidewall, and structures of the multiple wiring layers including a lateral face contact protruding from the sidewall;
wherein the daughter carrier substrate, the first chip and the second chip are configured in the daughter carrier substrate accommodating slot, and the lateral face of the mother substrate interconnecting bump faces towards the sidewall of the daughter carrier substrate accommodating slot, and the mother substrate interconnecting bump of the daughter carrier substrate connects with the lateral face contact of the mother carrier substrate through the solder layer on the lateral face.

19. The package structure with interconnection between chips as claimed in claim 12, wherein,
the lateral face of the mother substrate interconnecting bump is aligned along a cutting plane of the substrate.

* * * * *